US006864522B2

(12) United States Patent
Krieger et al.

(10) Patent No.: US 6,864,522 B2
(45) Date of Patent: Mar. 8, 2005

(54) MEMORY DEVICE

(75) Inventors: Juri H. Krieger, Brookline, MA (US); Nikolai Yudanov, Brookline, MA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 167 days.

(21) Appl. No.: 10/414,353

(22) Filed: Apr. 15, 2003

(65) Prior Publication Data

US 2003/0179633 A1 Sep. 25, 2003

Related U.S. Application Data

(63) Continuation of application No. 10/238,880, filed on Sep. 18, 2002, which is a continuation-in-part of application No. PCT/RU01/00334, filed on Aug. 13, 2001.

(51) Int. Cl.[7] .................... H01L 27/108; H01L 29/76; H01L 29/788; H01L 31/119
(52) U.S. Cl. ........................................ 257/296; 257/68
(58) Field of Search ..................... 257/296, 68, 288, 257/905, 906, 908

(56) References Cited

U.S. PATENT DOCUMENTS

| | | | |
|---|---|---|---|
| 3,719,933 A | | 3/1973 | Wakabayashi et al. |
| 3,810,127 A | | 5/1974 | Hoff, Jr. |
| 4,146,876 A | * | 3/1979 | Arelano et al. ............ 345/105 |
| 4,267,558 A | | 5/1981 | Guterman |
| 4,267,583 A | | 5/1981 | Suzuki |
| 4,371,883 A | | 2/1983 | Potember et al. |
| 4,616,340 A | | 10/1986 | Hayashi et al. |
| 4,631,562 A | | 12/1986 | Avery |
| 4,652,894 A | | 3/1987 | Potember et al. |
| 4,677,742 A | | 7/1987 | Johnson |
| 4,727,514 A | | 2/1988 | Bhuva et al. |
| 4,733,375 A | | 3/1988 | Terashima |

(List continued on next page.)

FOREIGN PATENT DOCUMENTS

| | | |
|---|---|---|
| DE | 196 40 239 A1 | 4/1998 |
| DE | 199 59 904 A1 | 6/2001 |

(List continued on next page.)

OTHER PUBLICATIONS

"A Disrupted Organic Film: Could Memories Be Made of This?" *ORNL Review*, vol. 33, No. 2, 2000.
"Technical Summary of Programmable Metallization Cell Memory Technology," Version 1.3, Dec. 2001.
"The 1998 Conference Archive," *The Sixth Foresight Conference on Molecular Nanotechnology*, Nov. 12–15, 1998, www.foresight.org/Conferences/MNT6/index.html.
Beck, A. et al., "Reproducible Switching Effect in Thin Oxide Films for Memory Applications," *Applied Physics Letters*, vol. 77, No. 1, pp. 139–141, Jul. 3, 2000.
Bernard, Allen, "A Big Name in Chips Helps Coatue in Molecular Memory Race," Aug. 27, 2000, www.nanoelectronicsplanet.com/features/article/0,4028,6571–1452831,00.html.

(List continued on next page.)

*Primary Examiner*—David Nhu
(74) *Attorney, Agent, or Firm*—Amin & Turocy, LLP

(57) ABSTRACT

A memory storage and retrieval device containing (a) an electrically conductive first electrode; (b) an electrically conductive second electrode; (c) a layer stack intermediate the first and second electrodes containing (d) at least one active layer with variable electrical conductivity; and (e) at least one passive layer containing a source material for varying the electrical conductivity of the at least one active layer upon application of an electrical potential difference between the first and second electrodes.

30 Claims, 4 Drawing Sheets

U.S. PATENT DOCUMENTS

| | | | |
|---|---|---|---|
| 4,834,911 A | | 5/1989 | Carew |
| 4,839,700 A | | 6/1989 | Ramesham et al. |
| 4,860,254 A | | 8/1989 | Pott et al. |
| 5,012,445 A | | 4/1991 | Kazuaki et al. |
| 5,034,192 A | | 7/1991 | Wrighton et al. |
| 5,054,894 A | * | 10/1991 | Warszawski ............... 359/270 |
| 5,130,380 A | | 7/1992 | Carew |
| 5,136,212 A | | 8/1992 | Eguchi et al. |
| 5,153,681 A | | 10/1992 | Kishimoto et al. |
| 5,196,912 A | | 3/1993 | Matsumoto et al. |
| 5,206,525 A | | 4/1993 | Yamamoto et al. |
| 5,245,543 A | | 9/1993 | Smayling et al. |
| 5,296,716 A | | 3/1994 | Ovshinsky et al. |
| 5,315,131 A | | 5/1994 | Kishimoto et al. |
| 5,319,564 A | | 6/1994 | Smayling et al. |
| 5,355,235 A | | 10/1994 | Nishizawa et al. |
| 5,392,236 A | | 2/1995 | Hashimoto |
| 5,412,614 A | | 5/1995 | Bird |
| RE34,974 E | | 6/1995 | Terashima |
| 5,431,883 A | | 7/1995 | Barraud |
| 5,440,518 A | | 8/1995 | Hazani |
| 5,563,081 A | | 10/1996 | Ozawa |
| 5,572,472 A | | 11/1996 | Kearney et al. |
| 5,579,199 A | | 11/1996 | Kawamura et al. |
| 5,670,818 A | | 9/1997 | Forouhi et al. |
| 5,691,935 A | | 11/1997 | Douglass |
| 5,698,874 A | | 12/1997 | Hayashi |
| 5,734,605 A | | 3/1998 | Zhu et al. |
| 5,761,115 A | | 6/1998 | Kozicki et al. |
| 5,770,885 A | | 6/1998 | McCollum et al. |
| 5,818,749 A | | 10/1998 | Harshfield |
| 5,849,403 A | | 12/1998 | Aoki et al. |
| 5,869,882 A | | 2/1999 | Chen et al. |
| 5,896,312 A | | 4/1999 | Kozicki et al. |
| 5,900,662 A | | 5/1999 | Frisina et al. |
| 5,914,893 A | | 6/1999 | Kozicki et al. |
| 6,055,180 A | * | 4/2000 | Gudesen et al. ............ 365/175 |
| 6,060,338 A | | 5/2000 | Tanaka et al. |
| 6,064,589 A | | 5/2000 | Walker |
| 6,088,319 A | | 7/2000 | Gudesen |
| 6,118,684 A | | 9/2000 | Yihong et al. |
| 6,128,214 A | | 10/2000 | Kuekes et al. |
| 6,150,705 A | | 11/2000 | Chen |
| 6,288,697 B1 | | 9/2001 | Eto et al. |
| 6,292,396 B1 | | 9/2001 | Tailliet |
| 6,326,936 B1 | | 12/2001 | Inganas et al. |
| 6,349,054 B1 | | 2/2002 | Hidaka |
| 6,353,559 B2 | | 3/2002 | Hasegawa et al. |
| 6,384,427 B1 | | 5/2002 | Yamazaki et al. |
| 6,403,396 B1 | | 6/2002 | Gudesen et al. |
| 6,403,397 B1 | | 6/2002 | Katz |
| 6,407,953 B1 | | 6/2002 | Cleeves |
| 6,418,049 B1 | | 7/2002 | Kozicki et al. |
| 6,424,553 B2 | | 7/2002 | Berggren et al. |
| 6,426,891 B1 | | 7/2002 | Katori |
| 6,429,457 B1 | | 8/2002 | Berggren et al. |
| 6,432,739 B1 | | 8/2002 | Gudesen et al. |
| 6,449,184 B2 | | 9/2002 | Kato et al. |
| 6,459,095 B1 | | 10/2002 | Heath et al. |
| 6,461,916 B1 | | 10/2002 | Adachi et al. |
| 6,487,106 B1 | | 11/2002 | Kozicki et al. |

FOREIGN PATENT DOCUMENTS

| | | |
|---|---|---|
| EP | 0 268 370 A3 | 5/1988 |
| EP | 0 385 688 A2 | 9/1990 |
| EP | 0 727 822 A2 | 8/1996 |
| JP | 7-106440 | 4/1995 |
| RU | 2071126 C1 | 12/1996 |
| WO | WO 93/04506 A1 | 3/1993 |
| WO | WO 99/04440 A1 | 1/1999 |
| WO | WO 99/08325 A2 | 2/1999 |
| WO | WO 99/14762 A1 | 3/1999 |
| WO | WO 99/19900 A2 | 4/1999 |
| WO | WO 00/26918 A1 | 5/2000 |
| WO | WO 00/48196 A1 | 8/2000 |
| WO | WO 02/35580 A2 | 5/2002 |
| WO | WO 02/37500 A1 | 5/2002 |
| WO | WO 02/43071 A1 | 5/2002 |
| WO | WO 02/078003 A2 | 10/2002 |
| WO | WO 02/091384 A1 | 11/2002 |
| WO | WO 02/091385 A1 | 11/2002 |
| WO | WO 02/091476 A1 | 11/2002 |
| WO | WO 02/091494 A1 | 11/2002 |
| WO | WO 02/091495 A2 | 11/2002 |
| WO | WO 02/091496 A2 | 11/2002 |
| WO | WO 03/017282 A1 | 2/2003 |

OTHER PUBLICATIONS

Chen, J. et al., "Room–temperature Negative Differential Resistance in Nanoscale Molecular Junctions," *Applied Physics Letters*, vol. 77, No. 8, Aug. 21, 2000.

Collier, C. P. et al., "Electrically Configurable Molecular–Based Logic Gates," *Science*, vol. 285, pp. 391–394, Jul. 16, 1999.

Gannon, Andrew, "Toward the Next Generation CD," *Physical Review Focus*, Feb. 16, 2000.

Gao, H. .J. et al., "Reversible, Nanometer–Scale Conductance Transitions in an Organic Complex," *Physical Review Letters*, vol. 84, No. 8, pp. 1780–1783, Feb. 21, 2000.

Gao, H. .J. et al., "Using a New Kind of Organic Complex System of Electrical Bistability for Ultrahigh Density Data Storage," *J. Vac. Sci. Technol. B* vol. 15, No. 4, pp. 1581–1583, Jul./Aug. 1997.

International Search Report, PCT/RU01/00334, search completed Feb. 14, 2002.

International Search Report, PCT/US02/14326, search completed Aug. 14, 2002.

International Search Report, PCT/US02/14237, search completed Sep. 9, 2002.

International Search Report, PCT/US02/14238, search completed Aug. 9, 2002.

International Search Report, PCT/US02/14239, search completed Aug. 20, 2002.

International Search Report, PCT/US02/14269, search completed Mar. 27, 2003.

International Search Report, PCT/US02/14270, search completed Mar. 28, 2003.

Japanese patent abstract of publication No. 01–103137, Apr. 20, 1989.

Japanese patent abstract of publication No. 01278781, Nov. 9, 1989.

Japanese patent abstract of publication No. 61107723, May 26, 1986.

Japanese patent abstract of publication No. 63293729, Nov. 30, 1998.

Krieger, Ju. H. et al., "Molecular Analogue Memory Cell Based on Electrical Switching and Memory in Molecular Thin Films," *Synthetic Metals*, 7730 (2000), pp. 1–4.

Krieger, Juri H. et al., "Molecular Analogue Memory Cell," *Sixth Foresight Conference on Molecular Nanotechnology*, Santa Clara, California, Nov. 12–15, 1998.

Krieger, Yu. G. et al., "Study of Test Structures of a Molecular Memory Element," *Institute of Inorganic Chemistry*, Siberian Branch, Russian Academy of Sciences. Translated from *Zhurnal Strukturnoi Khimii*, vol. 34, No. 6, pp. 152–156, Nov.–Dec. 1993. Original article Submitted Apr. 27, 1993.

Krieger, Yu. G., "Molecular Electronics: Current State and Future Trends," *Journal of Structure Chemistry*, vol. 34, No. 6, pp. 896–904, Nov.–Dec. 1993.

Krieger, Yu. H., "Structural Instability of One–Dimensional Systems as a Physical Principle Underlying the Functioning of Molecular Electronic Devices," *Journal of Structural Chemistry*, vol. 40, No. 4, pp. 594–619, Jul.–Aug. 1999.

Kurita, Ryo et al., "Field Modulation Effects on Charge–Density–Wave Conduction in $NbSe_3$," *Physica B*, 284–288 (2000), pp. 1161–1662.

Ma, L. P. et al., "Data Storage With 0.7 nm Recording Marks on a Crystalline Organic Thin Film by a Scanning Tunneling Microscope," *Applied Physics Letters*, vol. 73, No. 6, pp. 850–852, Aug. 10, 1998.

Ma, L.P. et al., "Nanometer–Scale Recording on an Organic Complex Thin Film With a Scanning Tunneling Microscope," *Applied Physics Letters*, vol. 69, No. 24, pp. 3752–3753, Dec. 9, 1996.

Machida, Yasuhiko et al., "Electrical Switching in Evaporated Lead Phthalocyanine Films," *Japanese Journal of Applied Physics*, vol. 28, No. 2, pp. 297–298, Feb. 1989.

Ovshinsky, Standford R., "Localized States in the Gap of Amorphous Semiconductors," *Physical Review Letters*, vol. 36, No. 24, pp. 1469–1472, Jun. 14, 1976.

Potember, R. S. et al., "Electrical Switching and Memory Phenomena in Cu–TCNQ Thin Films," *Applied Physics Letters*, vol. 34, No. 6, pp. 405–407, Mar. 15, 1979.

Reed, M.A. et al., "Molecular Random Access Memory Cell," *Applied Physics Letters*, vol. 78, No. 23, pp. 3735–3737, Jun. 4, 2001.

Rossel, C. et al., "Electrical Current Distribution Across a Metal–Insulator–Metal Structure During Bistable Switching," Apr. 24, 2001.

Rotman, David, "Molecular Memory," *Technology Review*, May 2001.

*Semiconductor Times*, pp. 5–6, Jul. 2002.

Strikeman, Alexandra, "Polymer Memory: The Plastic Path to Better Data Storage," *Technology Review*, p. 31, Sep. 2002.

Zhou, C. et al., "Nanoscale Metal/Self–Assembled Monolayer/Metal Heterostructures," *Applied Physics Letters*, vol. 71, No. 5, pp. 611–613, Aug. 4, 1997.

* cited by examiner

FIG. 1(A) Memory Cell in the "Off" State
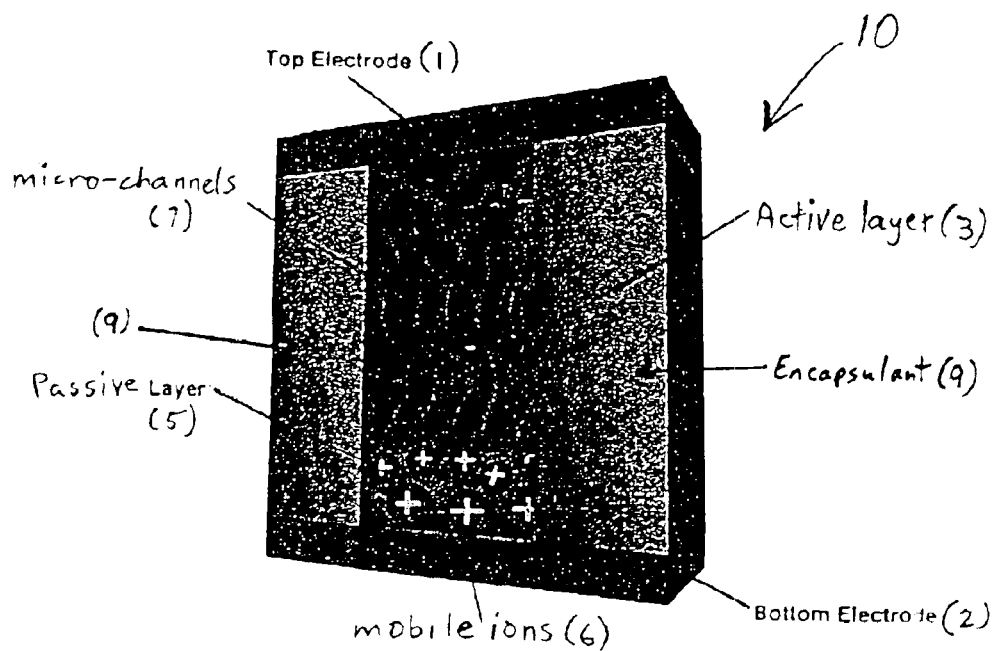
FIG. 1(B) Memory Cell in the "On" State
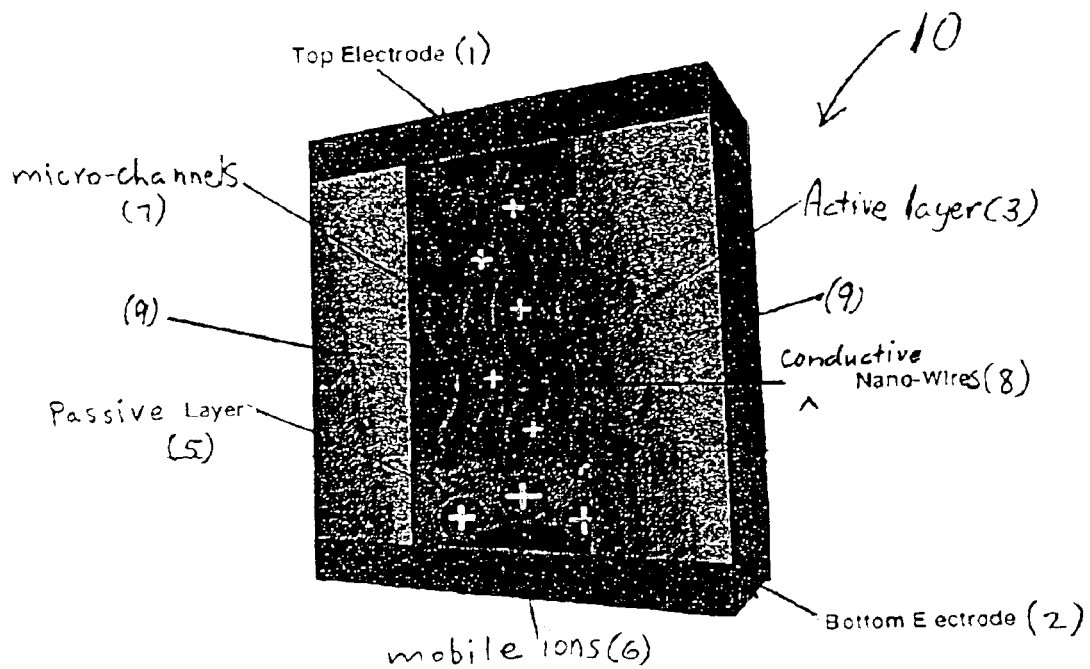

MEMORY DEVICE

CROSS-REFERENCE TO RELATED APPLICATION

This application is a continuation-in-part of PCT International Application PCT/RU01/00334, filed Aug. 13, 2001. This application is a continuation of U.S. application Ser. No. 10/238,880, filed Sep. 11, 2002. Both PCT International Application PCT/RU01/00334 and U.S. application Ser. No. 10/238,880 are hereby incorporated by reference in their entirety.

FIELD OF THE INVENTION

The present invention relates to novel memory devices. The invention is useful in the development, manufacture, and use of a variety of devices and/or technologies, including, inter alia, memory devices for electronic computers, associative memory systems, circuit elements with programmable resistance for creating synapses for neuronal nets, direct access data banks, and new types of video/audio equipment.

BACKGROUND OF THE INVENTION

Modern electronic computers employ several different types of memory devices for various purposes and functions requiring different performance/operating characteristics, e.g., read/write and storage/retrieval speeds. The multiplicity of different requirements for the various memory devices substantially complicates the operation of computer systems, increases start-up times, and complicates data storage.

As a consequence of the above-mentioned drawbacks and disadvantages associated with current memory device technology, a high priority task of the microelectronics industry is creation/development of a universal memory device/system having high read/write speeds, high storage density, and long term data retention characteristics.

A number of electronic memory or switching devices have been proposed or developed which include a bi-stable element that can be controllably alternated between high impedance and low impedance states by application of an electrical input, e.g., a voltage equal to or greater than a threshold voltage. Memory and switching devices utilizing such threshold-type behavior have been demonstrated with both organic and inorganic thin film semiconductor materials, including amorphous silicon, chalcogenides such as arsenic trisulphide-silver ($As_2S_3$—Ag), organic materials, and heterostructures such as $SrZrO_3$(0.2% Cr)/$SrRuO_3$. See, for example: U.S. Pat. Nos. 5,761,115; 5,896,312; 5,914,893; 5,670,818; 5,770,885; and 6,150,705; Russian Patent No. 2,071,126; S. R. Ovshinsky, Phys. Rev. Lett., 36, 1469 (1976); J. H. Krieger, et al., J. Struct. Chem., 34, 966 (1993); J. H. Krieger, et al., Synthetic Metals, 122, 199 (2001); R. S. Potember, et al., Appl. Phys. Lett., 34 (6), 405 (1979); Y. Machida, et al., Jap. J. Appl. Phys., Part 1, 28 (2), 297 (1989); A. Beck, et al., Appl. Phys. Lett., 77, 139 (2000); and C. Rossel et al., J. Appl. Phys. (2001), in press.

U.S. Pat. No. 6,055,180 to Gudeson, et al. discloses an electrically addressable, passive storage device for registration, storage, and/or processing of data, comprising a functional medium in the form of a continuous or patterned structure capable of undergoing a physical or chemical change of state. The functional medium comprises individually addressable cells each of which represents a registered or detected value or is assigned a predetermined logical value. Each cell is sandwiched between an anode and cathode (electrode means) which contact the functional medium of the cell for electrical coupling therethrough, with the functional medium having a non-linear impedance characteristic, whereby the cell can be directly supplied with energy for effecting a change in the physical or chemical state in the cell.

A disadvantage/drawback of the storage device of U.S. Pat. No. 6,055,180, however, is that writing of information can occur only once, and reading of the stored information is performed optically, thereby increasing the size and complexity of the device and its use, at the same time reducing reliability of reading of the information due to the difficulty in accurately positioning the optical beam. In addition, an alternate writing method utilizing thermal breakdown caused by application of a high voltage is also disadvantageous in that writing of information can only occur once, and high voltages, hence high electrical fields, are required.

JP 62-260401 discloses a memory cell with a three-layer structure comprised of a pair of electrodes with a high temperature compound (i.e., molecule) sandwiched therebetween, which memory cell operates on a principle relying upon a change of electrical resistance of the compound upon application of an external electric field. Since the conductivity of the compound can be controllably altered between two very different levels, information in bit form can be stored therein.

U.S. Pat. No. 5,761,116 to Kozicki et al. discloses a "programmable metallization cell" comprised of a "fast ion conductor", such as a film or layer of a chalcogenide doped with a metal ion, e.g., silver or copper, and a pair of electrodes, i.e., an anode (e.g., of silver) and a cathode (e.g., of aluminum), spaced apart at a set distance on the surface of the doped chalcogenide. The silver or copper ions can be caused to move through the chalcogenide film or layer under the influence of an electric field. Thus, when a voltage is applied between the anode and the cathode, a non-volatile metal dendrite ("nano-wire") grows on the surface of the chalcogenide film or layer ("fast ion conductor") from the cathode to the anode, significantly reducing the electrical resistance between the anode and cathode. The growth rate of the dendrite is a function of the applied voltage and the interval of its application. Dendrite growth may be terminated by removing the applied voltage and the dendrite may be retracted towards the cathode by reversing the polarity of the applied voltage.

U.S. Pat. No. 5,670,818 to Forouhi et al. discloses a read-only memory device in the form of an electrically programmable antifuse comprised of a layer of amorphous silicon between metal conductors. Under application of a high voltage, a portion of the amorphous silicon layer undergoes a phase change and atoms from the metal conductors migrate into the silicon layer, resulting in formation of a thin conducting filament ("nano-wire") composed of a complex mixture of silicon and metal.

The principal shortcomings of the above-described memory devices relying upon nano-wire formation are related to the low operational speeds caused by the extended interval required for effecting substantial change in the electrical resistance between the electrodes/conductors and to the high voltage required, e.g., ~60 V. Such drawbacks significantly limit practical use of the cells in current high speed electronic devices.

U.S. Pat. No. 4,652,894 to Potember et al. discloses a current-controlled, bi-stable threshold or memory switch, comprised of a layer of a polycrystalline metal-organic semiconductor material sandwiched between a pair of metallic electrodes, wherein the layer of metal-organic semiconductor material is an electron acceptor for providing fast switching at low voltages between high and low impedance states.

Practical implementation of the threshold memory switch of U.S. Pat. No. 4,652,894 is limited, however, principally due to the use of low temperature metal-organic semiconductor compounds which are not sufficiently mechanically robust, and more importantly, are insufficiently resistant to chemical degradation when subjected to the elevated temperatures commonly associated with modern semiconductor manufacturing processing, i.e., greater than about 150° C. and as high as about 400° C. In addition, the physical characteristics of the metal-organic semiconductor materials cause poor repeatability of the read/write/erase cycle, and storage is limited to only 1 bit of formation, thereby prohibiting use in high information density applications/devices.

In view of the above, there exists a clear need for memory devices which are free of the above-described shortcomings, drawbacks, and disadvantages associated with memory devices of the conventional art. The present invention, therefore, has as its principal aim the development of a universal memory device/system for high speed data storage and retrieval, with capability of long term storage at high bit densities.

DISCLOSURE OF THE INVENTION

An advantage of the present invention is an improved memory storage and retrieval device.

Another advantage of the present invention is an improved memory storage and retrieval device not requiring formation of conventional semiconductor junctions.

Yet another advantage of the present invention is an improved memory storage and retrieval device which can be readily fabricated from a variety of materials.

Still another advantage of the present invention is an improved memory storage and retrieval device having very high read and write speeds, long term data retention, and high data storage density.

Additional advantages and other features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to an aspect of the present invention, the foregoing and other advantages are obtained in part by a memory storage and retrieval device, comprising:

(a) an electrically conductive first electrode;

(b) an electrically conductive second electrode; and (c) a layer stack intermediate the first and second electrodes, the layer stack comprising:

(d) at least one active layer with variable electrical conductivity; and (e) at least one passive layer comprised of a source material for varying the electrical conductivity of the at least one active layer upon application of an electrical potential difference between the first and second electrodes.

In accordance with embodiments of the present invention, the electrical conductivity of the at least one active layer is reversibly varied upon introduction and removal of charged species; and the at least one passive layer is comprised of a source material for reversibly donating the charged species to and accepting the charged species from the active layer.

According to preferred embodiments of the invention, the charged species comprise ions or a combination of ions and electrons, the ions being selected from the group consisting of: metal ions, metal-containing ions, non-metal ions, and non-metal-containing ions.

Embodiments of the present invention include those wherein the layer stack comprises a pair of active layers in mutual contact; and the layer stack may further comprise:

(f) at least one barrier layer comprised of a material which impedes spontaneous movement of the charged species when the electrical potential difference is not applied between the first and second electrodes.

Further embodiments of the present invention include those wherein the at least one barrier layer is positioned within the stack intermediate the active layer and the passive layer; embodiments wherein the layer stack comprises first and second active layers and the at least one barrier layer is positioned within the stack intermediate the first and second active layers; and embodiments wherein the layer stack comprises first and second passive layers in respective contact with the first and second electrically conductive electrodes.

According to still further embodiments of the present invention, the at least one active layer and the at least one passive layer are each comprised of the same material, e.g., an intercalation compound such as $Li_xVSe_2$ or $Li_xHfSe_2$, whereby the stack effectively comprises a single layer.

In accordance with embodiments of the present invention, each of the first and second electrically conductive electrodes comprises at least one electrically conductive material selected from the group consisting of metals, metal alloys, metal nitrides, oxides, sulfides, carbon, and polymers; and according to particular embodiments of the invention, each of the first and second electrically conductive electrodes comprises at least one material selected from the group consisting of aluminum (Al), silver (Ag), copper (Cu), titanium (Ti), tungsten (W), their alloys and nitrides, amorphous carbon, transparent oxides, transparent sulfides, and conductive organic polymers, each of the first and second electrically conductive electrodes being from about 3,000 to about 8,000 Å thick, preferably about 5,000 Å thick.

According to embodiments of the present invention, the at least one active layer comprises at least one material with a relatively lower intrinsic electrical conductivity when free of the charged species and a relatively higher electrical conductivity when doped with the charged species, i.e., the at least one active layer comprises at least one material selected from the group consisting of dielectrics, semiconductors, ferroelectrics, ceramics, organic polymers, molecular crystals, and composites thereof, wherein the at least one active layer includes a plurality of channels or pores extending therethrough for facilitating movement of the charged species therein, selected from the group consisting of Si, amorphous Si, organic polymers, silicon dioxide ($SiO_2$), aluminum oxide ($Al_2O_3$), titanium dioxide ($TiO_2$), boron nitride (BN), carbon tri-nitride ($CN_3$), copper oxide ($Cu_2O$), vanadium oxide ($V_2O_3$), ferroelectric materials, materials containing electrolyte clusters, and intercalation compounds selected from $Li_xVSe_2$ and $Li_x$-$HfSe_2$; and the at least one active layer is from about 50 to about 1,000 Å thick, preferably about 100 Å thick.

In accordance with embodiments of the present invention, the at least one passive layer comprises at least one super-ionic conductor material or intercalation compound, wherein the at least one super-ionic conductor material or intercalation compound reversibly donates and accepts charged species; e.g., ions or ions+electrons, the ions being selected from the group consisting of silver (Ag), copper (Cu), gold (Au), lithium (Li), sodium (Na), potassium (K), zinc (Zn), magnesium (Mg), other metal or metal-containing ions, hydrogen (H), oxygen (O), fluorine (F), and other halogen-containing ions; and the at least one super-ionic conductor material or intercalation compound is selected from the group consisting of AgI, AgBr, $Ag_2S$, $Ag_2Se$, $Ag_{2-x}Te$, $RbAg_4I_5$, CuI, CuBr, $Cu_{2-x}S$, $Cu_{2-x}Se$, $Cu_{2-x}Te$, $Ag_xCu_{2-x}S$, $Cu_3HgI_4$, $Cu_3HgI_4$, AuI, $Au_2S$, $Au_2Se$, $Au_2S_3$, $Na_xCu_ySe_2$, $LiNiO_2$, $Li_xTiS_2$, $Li_xMoSe_2$, $Li_xTaS_2$, $Li_xVSe_2$, $Li_xHfSe_2$, $Li_xWO_3$, $Cu_xWO_3$, $Na_xWO_3$, $Na\beta-Al_2O_3$, $(AgI)_x(Ag_2O_nB_2O_3)_{1-x}$, $Ag_2CdI_4$, $Cu_xPb_{1-x}Br_{2-x}$, $Li_3M_2(PO_4)_3$— where M=Fe, Sc, or Cr, $K_3Nb_3B_2O_{12}$, $K_{1-x}Ti_{1-x}Nb_xOPO_4$, $SrZr_{1-x}Yb_xO_3$, $Sr_{1-x/2}Ti_{1-x}$, $Nb_xO_{3-\delta}$, $\beta-Mg_3Bi_2$, $Cs_5H_3(SO_4)_x \cdot H_2O$, $M_3H(XO_4)_2$—where M=Rb, Cs, or $NH_4$ and X=Se or S, $NaZr_2(PO_4)_3$, $Na_{4.5}FeP_2O_8(OF)_{1-x}$, $ZrO_{2-x}$, $CeO_{2-x}$, $CaF_2$, and $BaF_2$, and is from about 20 to about 100 Å thick, preferably about 50 Å thick.

According to embodiments of the present invention, the at least one barrier layer comprises at least one material selected from the group consisting of $Li_3N$ and $LiAlF_4$ and is from about 20 to about 300 Å thick, preferably about 50 Å thick.

Additional advantages and aspects of the present invention will become readily apparent to those skilled in the art from the following description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

The following detailed description of the embodiments of the present invention can best be understood when read in conjunction with the following drawings, in which similar reference numerals are employed throughout to designate similar features, and in which the various features are not necessarily drawn to scale but rather are drawn as to best illustrate the pertinent features, wherein:

FIGS. 1(A)–1(B), show, in schematic, partially cut-away perspective view, an example of a two-layer memory device 10 according to the invention for illustrating the principle of conductivity modulation;

DESCRIPTION OF THE INVENTION

Figure 2:
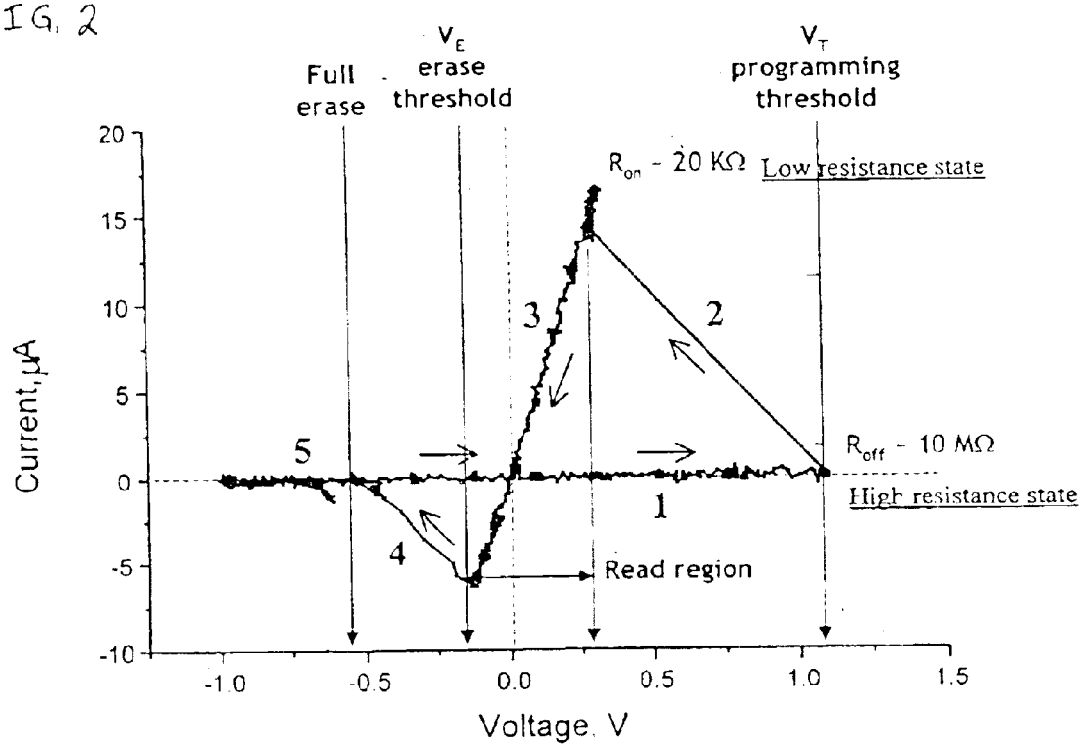
FIG. 2 is a current (I)-voltage (V) plot for illustrating operation of memory devices according to the invention.

The present invention is based upon the discovery by the inventors that: (1) materials exist, or can be prepared, which can be made to exhibit reversible change, i.e., modulation, of their electrical conductivity upon application and subsequent removal of an electrical field; and (2) useful devices, in particular memory devices, can be fabricated wherein the phenomenon of reversible conductivity change or modulation exhibited by such materials forms the basis for operation of the devices.

Specifically, there exists a large class of materials with relatively low intrinsic electrical conductivity, including various dielectrics, ferroelectrics, semiconductors, ceramics, organic polymers, molecular crystals, and composites of the aforementioned materials, which are potentially useful as an active layer of a memory device, which materials can be formed into layers exhibiting a substantial increase in conductivity (i.e., conductivity modulation) when doped with charged species of various types, for example ions or a combination of ions and electrons, which are introduced thereinto under the influence of an applied electrical field of a first polarity, and which layers reversibly exhibit a substantial decrease in electrical conductivity when the charged species are caused to be at least partially withdrawn therefrom by application of an electrical field of a second, opposite polarity. Thus, active layers according to the present invention are susceptible to conductivity modulation by means of reversible doping/withdrawal of charged species, e.g., ions or ions+electrons, under the influence of applied electric fields of appropriate polarity. According to the inventive methodology, materials suitable for use as the active layers typically comprise a plurality of microchannels or pores for facilitating reversible movement of the charged species therethrough, and typically are selected from among Si, amorphous Si, organic polymers, silicon dioxide ($SiO_2$), aluminum oxide ($Al_2O_3$), titanium dioxide ($TiO_2$), vanadium oxide ($V_2O_3$), boron nitride (BN), carbon tri-nitride ($CN_3$), copper oxide ($Cu_2O$), ferroelectric materials, materials containing electrolyte clusters, and intercalation compounds selected from $Li_xVSe_2$ and $Li_xHfSe_2$.

A key feature of the present invention is the presence of an additional layer of material, termed a passive layer, for reversibly functioning as a source of the charged species, e.g., ions or ions+electrons, which are introduced (injected) into the active layer during application of the first polarity electrical field and as an acceptor (sink) of the charged species which are removed (withdrawn) from the active layer during application of the second, opposite polarity electrical field. According to the invention, materials suitable for use as the passive layer include those which readily and reversibly donate/accept charged species, for example, compounds with mobile ions, including super-ionic conductors and intercalation compounds, e.g., AgI, AgBr, $Ag_2S$, $Ag_2Se$, $Ag_{2-x}Te$, $RbAg_4I_5$, CuI, CuBr, $Cu_{2-x}S$, $Cu_{2-x}Se$, $Cu_{2-x}Te$, $Ag_xCu_{2-x}S$, $Cu_3HgI_4$, $Cu_3HgI_4$, AuI, $Au_2S$, $Au_2Se$, $Au_2S_3$, $Na_xCu_ySe_2$, $LiNiO_2$, $Li_xTiS_2$, $Li_xMoSe_2$, $Li_xTaS_2$, $Li_xVSe_2$, $Li_xHfSe_2$, $Li_xWO_3$, $Cu_xWO_3$, $Na_xWO_3$, $Na\beta-Al_2O_3$, $(AgI)_x(Ag_2O_nB_2O_3)_{1-x}$, $Ag_2CdI_4$, $Cu_{xPb1-x}Br_{2-x}$, $Li_3M_2(PO_4)_3$—where M=Fe, Sc, or Cr, $K_3Nb_3B_2O_{12}$, $K_{1-x}Ti_{1-x}Nb_xOPO_4$, $SrZr_{1-x}Yb_xO_3$, $Sr_{1-x/2}Ti_{1-x}$, $Nb_xO_{3-\delta}$, $\beta-Mg_3Bi_2$, $Cs_5H_3(SO_4)_x \cdot H_2O$, $M_3H(XO_4)_2$—where M=Rb, Cs, or $NH_4$ and X=Se or S, $NaZr_2(PO_4)_3$, $Na_{4.5}FeP_2O_8(OF)_{1-x}$, $ZrO_{2-x}$, $CeO_{2-x}$, $CaF_2$, and $BaF_2$, which materials reversibly donate/accept silver (Ag), copper (Cu), gold (Au), lithium (Li), sodium (Na), potassium (K), zinc (Zn), magnesium (Mg), other metal or metal-containing ions, hydrogen (H), oxygen (O), fluorine (F), and other halogen-containing ions.

Several of the above-listed materials, e.g., $Li_xVSe_2$, $Li_xHfSe_2$, may be simultaneously utilized for the active layer and the passive layer, whereby embodiments of memory devices fabricated according to the invention with such materials capable of simultaneously functioning as the active and passive layers effectively comprise a single layer sandwiched between a pair of electrodes.

Materials usable as the passive layer are characterized by the ease, i.e., rapidity, with which they donate and accept charged species, e.g., ions or ions+electrons, under the influence of a relatively weak electric field, i.e., within the range of electric fields used in typical semiconductor devices such as flash memories. Thus, application of a first polarity electric field to a layer stack comprised of at least one active layer and at least one passive layer will draw charged species such as ions or ions+electrons from the latter into the former, and application of a second, opposite polarity electric field will "pull" at least some of the ions or ions+electrons out of the former layer and return them to the latter layer. Further, the donation and acceptance of the charged species is reversible and can be modulated for extremely long time periods and for millions of cycles.

According to the invention, the performance of memory cells or devices is a function of the conductivity modulation characteristics of the material(s) of the active layer. Thus, the ease with which charged species such as ions or ions+ electrons are reversibly donated to the active layer (i.e., doped therein) and withdrawn therefrom determines the ease with which "programming" and "erasing" of the memory device occurs. Since this feature necessitates facile movement of the charged species, e.g., ions or ions+electrons, into and out from the active layer, the ions or ions+electrons will travel freely in the material, and thus have a tendency to return to their initial state or location under the influence of internal electrical fields (as during absence of the externally applied electrical field). Therefore, according to the invention, in order to improve the data retention characteristics of the memory devices, the interval during which relaxation occurs is controlled, i.e., the interval when the previously injected mobile ions or ions+electrons are partially displaced or move out of the active layer and return to the passive layer and the conductivity therefore decreases, is controlled. Such control may, for example, be achieved by providing at least one barrier layer for impeding motion of the charged species in the absence of an applied electrical field. Therefore, for a material to be useful as a barrier layer, it must have the property of not permitting easy travel therethrough of charged species such as ions or ions+ electrons, or a property of not attracting, or even repelling, ions or ions+electrons. Thus, the barrier layer limits spontaneous movement of the charged species (i.e., movement in the absence of an externally applied electric field) between the active layer and the passive layer, thereby increasing the data retention time of the memory device. Suitable materials for use as the barrier layer according to the invention include $Li_3N$ and $LiAlF_4$.

According to the invention, a layer stack is formed which comprises at least one active layer and at least one passive layer, and optionally including at least one barrier layer. The layer stack is sandwiched between a pair of electrically conductive electrodes which serve as electrical connections for supplying the requisite externally applied electrical fields. Suitable electrically conductive materials for use as electrodes include metals, metal alloys, metal nitrides, oxides, sulfides, carbon, and polymers, including for example: aluminum (Al), silver (Ag), copper (Cu), titanium (Ti), tungsten (W), their alloys and nitrides, amorphous carbon, transparent oxides, transparent sulfides, and organic polymers. The work functions of the particular materials utilized for the electrodes determines the ease with which charged species are injected into the device under the influence of the applied electric field, and in turn, affects the memory function of the device, i.e., the speed at which the device can be programmed, read, and erased, as well as the amount of electrical power required to perform these functions. In addition, one of the electrodes may, in some instances, serve as a reactant material for forming the passive layer of the device.

Referring now to FIGS. 1(A)–1(B), shown therein, in schematic, partially cut-away perspective view, is an example of a two-layer memory device 10 according to the invention for illustrating the principle of conductivity modulation. As illustrated, memory device 10 comprises an upper electrode 1 and a lower electrode 2 with a layer stack interposed therebetween, comprised of an upper, active layer 3 (bounded on opposite vertically extending sides by encapsulation layer 9) in contact with upper electrode 1 and a lower, passive layer 5 in contact with lower electrode 2. Passive layer 5 is a source (i.e., donor) and acceptor of a charged species, illustratively (but not limitatively) positively charged ions 6 (typically metal ions) and active layer 3 is a poorly electrically conducting material (e.g., an insulator) including a plurality of micro-channels or pores 7 extending generally vertically between passive layer 5 and upper electrode 1 for facilitating injection and transport of the ions 6 in the active layer 3. Thus, FIG. 1 (A) illustrates the condition of memory device 10 when in the high resistance, low conductivity "off" state, i.e., no applied electric field, with ions 6 essentially confined to passive layer 5 and the micro-channels or pores 7 substantially devoid of ions 6; whereas FIG. 1 (B) illustrates the condition of memory device 10 when in the low resistance, high conductivity "on" state, i.e., after application of an electric field of polarity and strength sufficient to cause ions 6 from the passive layer 5 to be injected (donated) into the micro-channels or pores 7 of the active layer 3 to form electrically conductive "nano-wires" 8. (In this regard, it should be noted that some ions 6 may be present within micro-channels or pores 7 when device 10 is in the "off" state; however, the amount of ions is insufficient to establish electrically conductive "nano-wires" 8).

Adverting to FIG. 2, shown therein is a current (I)-voltage (V) plot for illustrating operation of memory devices according to the invention. Starting at the origin of the plot (i.e., V and I=0), the voltage (V) applied to a device in the "off" (insulating, high resistance, or low conductivity) state is initially increased along curve 1. When the applied voltage reaches the programming threshold voltage $V_T$, typically in the range 0.5–4 V, the device quickly switches from the high resistance "off" state along curve 2. During programming, ions from the passive layer are mobilized by the applied electric field, injected into the active layer, and arranged into conductive micro-channels (as shown in FIG. 1 (B)). The sharp decrease in resistance corresponds to the point at which formation of the electrically conductive micro-channels is complete, thereby providing a low resistance.

The memory device can be read at any voltage below the threshold voltage $V_T$, i.e., the "read region". Thus, a low voltage may be utilized to probe the device and check its resistance, wherein a low current indicates the device is in the high resistance, "off" state, and a high current indicates the device is in the low resistance, "on" state. The "read" operation is non-destructive and does not disturb the state of the device.

From the low resistance state, the applied voltage may be reduced towards 0 V along curve 3. The slope of the I-V curve indicates the memory device is in the low resistance state, since the steeper the slope of the I-V curve, the lower the resistance. The difference between the "on" and "off" states is termed the "on/off ratio", which may be as high as 9 orders of magnitude for the inventive devices, i.e., from several M'Ω to ~100–200'Ω, but typically is ~4–6 orders of magnitude.

With the device in the low resistance "on" state, erase may be performed by applying an increasingly negative voltage (along curve 3) until the erase threshold voltage $V_E$ is reached, at which point the device rapidly switches back to the high resistance "off" state along curve 4. Erase threshold voltages $V_E$ are typically in the same range as programming threshold voltages $V_T$, but can be tuned depending upon the choice of materials for the active and passive layers, electrodes, and layer thicknesses. In conceptual terms, an erase operation corresponds to the removal of a minimum amount of charged species, e.g., ions from the microchannels or pores sufficient to interrupt continuity of the conductive nano-wires. As a consequence, only a small number of ions needs to be removed from the microchannels or pores to effectively sever the conductive wire and thereby increase the resistance.

Figure 3:
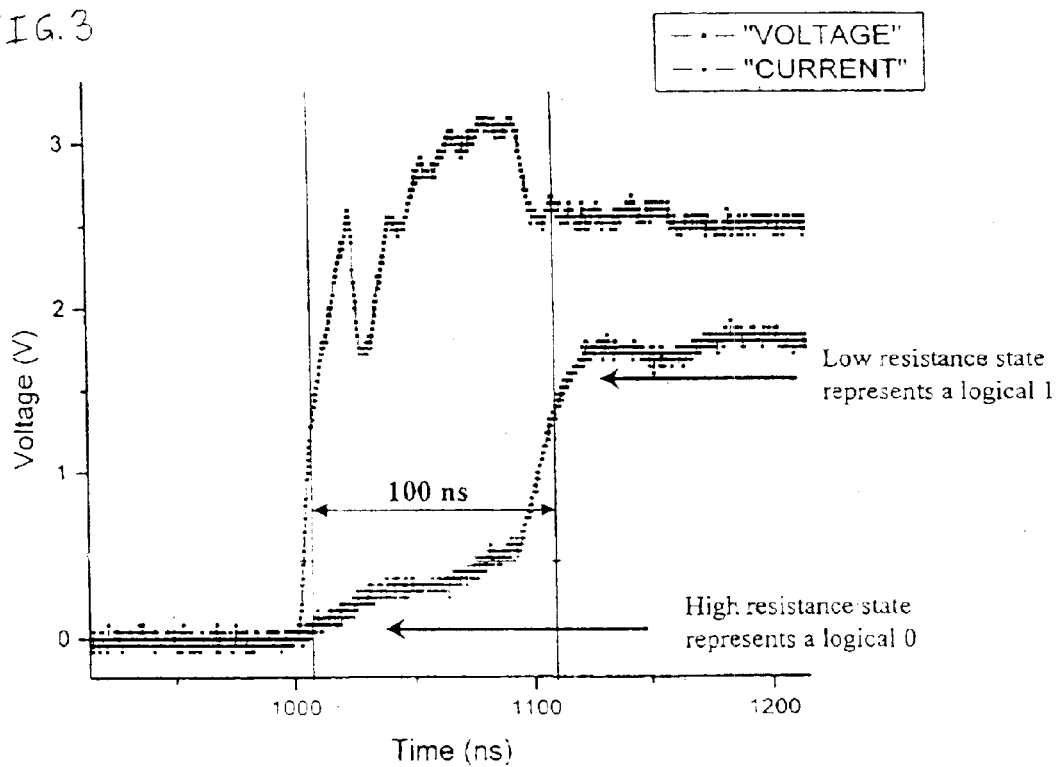
FIG. 3 is a plot of voltage (V) and current (I) vs. time (in nsec.) during switching of memory devices according to the invention from a high resistance "off" state (corresponding to a logical 0) to a low resistance "on" state (corresponding to a logical 1)

Referring to FIG. 3, which is a plot of voltage (V) and current (I) vs. time (in nsec.) during switching of memory devices according to the invention from a high resistance "off" state (corresponding to a logical 0) to a low resistance "on" state (corresponding to a logical 1), it is evident that switching times are very fast, i.e., on the order of about 100 nsec., indicating high operational speed.

A variety of device constructions comprising a layer stack between a pair of vertically spaced apart first and second electrodes are possible according to the invention, as illustrated in simplified, schematic cross-sectional view in FIGS. 4–9, wherein each of the various constituent layers is comprised of one or more of the above-described materials indicated as suitable for use as that constituent layer.

Figure 4:
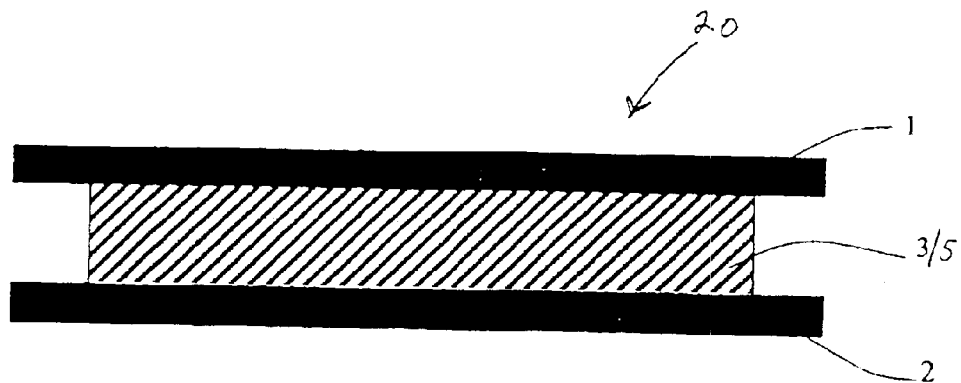
FIGS. 4–9 illustrate in simplified, schematic cross-sectional view, several memory device constructions according to the invention, each comprising a layer stack between a pair of vertically spaced apart first and second electrodes.
Figure 5:
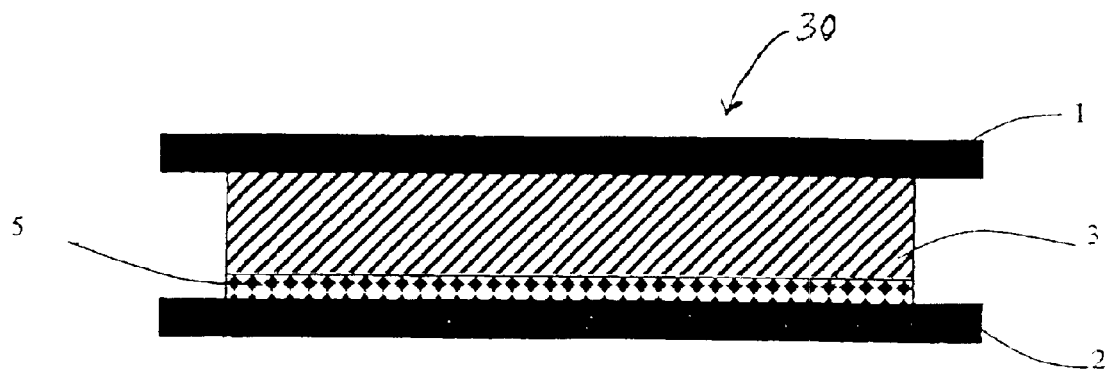
Figure 6:
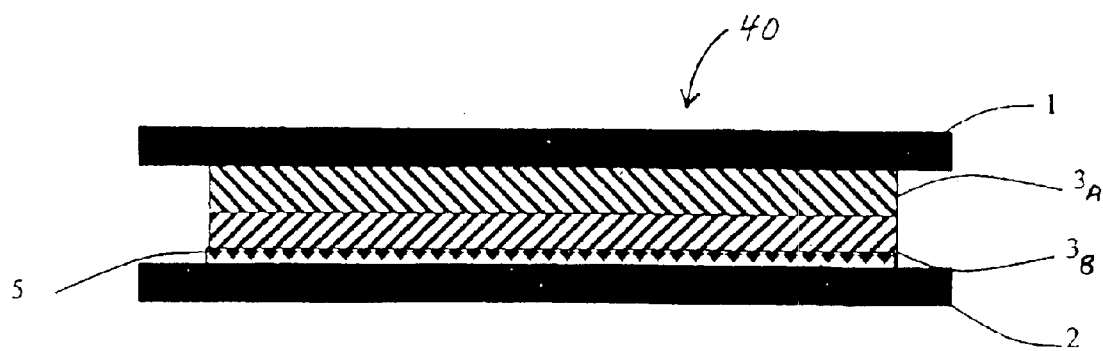
Figure 7:
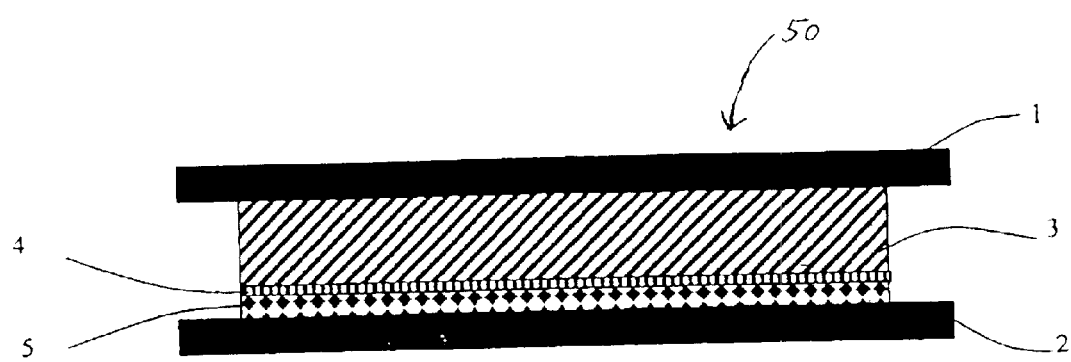
Figure 8:
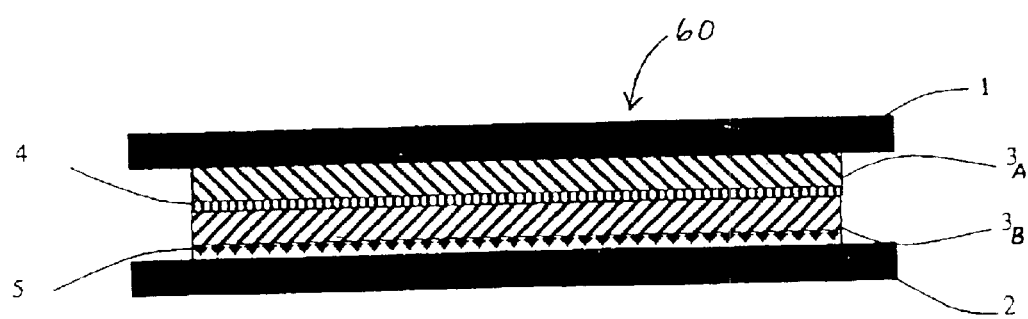
Figure 9:
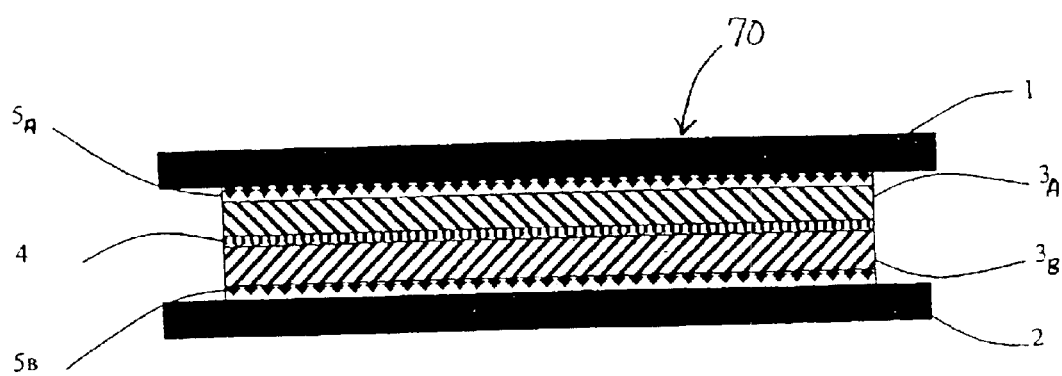

FIG. 4 shows a memory device 20 according to the invention, comprising a single layer sandwiched between a pair of electrodes, i.e., a combined active layer/passive layer 3/5 (such as of $Li_xVSe_2$ or $Li_xHfSe_2$, as described above), or a composite material comprised of a porous dielectric doped with ions or ion clusters) sandwiched between upper and lower electrodes 1 and 2;

FIG. 5 shows a memory device 30 according to the invention, comprising a layer stack sandwiched between upper and lower electrodes 1 and 2, the layer stack including an upper, active layer 3 and a lower, passive layer 5;

FIG. 6 shows a memory device 40 according to the invention, comprising a layer stack sandwiched between upper and lower electrodes 1 and 2, the layer stack including a pair of active layers 3 including a first, upper active layer $3_A$ and a second, lower active layer $3_B$, and a lower, passive layer 5;

FIG. 7 shows a memory device 50 according to the invention, comprising a layer stack sandwiched between upper and lower electrodes 1 and 2, the layer stack including an upper, active layer 3 and a lower, passive layer 5, with a barrier layer 4 inserted between the upper, active layer 3 and the lower, passive layer 5;

FIG. 8 shows a memory device 60 according to the invention, comprising a layer stack sandwiched between upper and lower electrodes 1 and 2, the layer stack including a pair of active layers 3 including a first, upper active layer $3_A$ and a second, lower active layer $3_B$, a barrier layer 4 inserted between the first, upper active layer $3_A$ and the second, lower active layer $3_B$, and a lower passive layer 5; and FIG. 9 shows a memory device 70 according to the invention, comprising a layer stack sandwiched between upper and lower electrodes 1 and 2, the layer stack including a first, upper passive layer $5_A$, a pair of active layers 3 including a first, upper active layer $3_A$ and a second, lower active layer $3_B$, a barrier layer 4 inserted between the first, upper active layer $3_A$ and the second, lower active layer $3_B$, and a second, lower passive layer $5_B$.

The thickness of each of the constituent layers of each of the embodiments illustrated in FIGS. 4–9 are as follows:

first and second electrically conductive electrodes 1 and 2: from about 3,000 to about 8,000 Å, with 5,000 Å presently preferred;

active layer 3 or active layers $3_A$ and $3_B$: from about 50 to about 1,000 Å thick, with 100 Å presently preferred;

passive layer 5 or passive layers $5_A$ and $5_B$: from about 20 to about 100 Å thick, with 50 Å presently preferred; and barrier layer 4: from about 20 to about 300 Å thick, with 50 Å presently preferred.

Each of the constituent layers may be prepared according to conventional techniques and methodologies and, for brevity's sake, details are not provided herein, except as noted below and in examples 1–17 described below:

the electrodes are formed via conventional thin film deposition techniques, e.g., thermal evaporation, sputtering, e-beam evaporation, etc.;

the passive layer may be formed by conventional thin film deposition techniques such as thermal evaporation, CVD, spin coating, or by first depositing a layer of a metal ultimately included in the passive layer, e.g., by reacting an initially formed Cu layer with a S, Se, or Te-containing gas or liquid to form a layer of a reaction product, e.g., $Cu_2S$ or $Cu_2Se$ in contact with the Cu layer;

porous active layers, such as porous Si or organic materials may be formed according to well-known thin film deposition techniques, such as thermal evaporation, spin coating, CVD, etc. Preferable pore sizes are 10–100 Å, with 30 Å preferred;

active layers comprising electrolyte clusters, i.e., groups of particles with 10–100 Å sizes may be introduced into the pores of porous Si or $SiO_2$ in a concentration of about 10–30% by dipping the porous Si or $SiO_2$ in a saturated electrolyte solution, followed by evaporation of the solvent to yield particles, i.e., clusters, of electrolyte.

materials such as refractory metal selenides, etc. may be formed by thermal CVD of gaseous precursors; e.g., $HfSe_2$ may be prepared by CVD from $HfCl_4$ and $H_2Se$.

EXAMPLE 1

$Ti/Li_xVSe_2/Al$ (or Ti), wherein $Li_xVSe_2$ serves as a combined active+passive layer (as in FIG. 4). The first, or lower electrode of Ti or Al was vapor deposited on the surface of an insulating layer at a thickness of about 3,000–8,000 Å, preferably about 5,000 Å. The $Li_xVSe_2$ combined active+passive layer was deposited via CVD at a thickness of about 50–300 Å, preferably about 100 Å, with Li ions intercalated by treatment with a solution of n-butyl lithium in hexane. The second, or upper electrode of Ti or Al was vapor deposited on the $Li_xVSe_2$ layer at a thickness of about 3,000–8,000 Å, preferably about 5,000 Å.

EXAMPLE 2

Ti/Li$_x$TiS$_2$/VSe$_2$/Al (or Ti), wherein Li$_x$TiS$_2$ serves as a passive layer and VSe$_2$ serves as an active layer (as in FIG. 5). This cell was fabricated in similar manner as Example 1, except that the VSe$_2$ active layer was deposited by CVD on the surface of the Li$_x$TiS$_2$ passive layer prior to deposition of the second, upper electrode. The thickness of the VSe$_2$ active layer was about 50–300 Å, preferably 100 Å.

EXAMPLE 3

Ti/Li$_x$VSe$_2$/HfSe$_2$/Al (or Ti), wherein Li$_x$VSe$_2$ serves as a passive layer and HfSe$_2$ serves as an active layer, each layer being deposited via CVD.

EXAMPLE 4

Ti/Li$_x$VSe$_2$/Li$_3$N/HfSe$_2$/Al (or Ti), wherein Li$_x$VSe$_2$ serves as a passive layer, Li$_3$N serves as a barrier layer, and VSe$_2$ serves as an active layer (as in FIG. 7). The Li$_3$N barrier layer may also be deposited via CVD and is about 20–100 Å thick, preferably about 50 Å thick.

EXAMPLE 5

Ti/Li$_x$TiS$_2$/a-Si/Al (or Ti), similar to Example 2, except for an amorphous silicon (a-Si) active layer (formed by CVD) substituted for VSe$_2$.

EXAMPLE 6

Ti/Li$_x$TiS$_2$/p-Si/Al (or Ti), similar to Example 5, except for a porous silicon (p-Si) active layer (formed by CVD) substituted for a-Si.

EXAMPLE 7

Ti/Li$_x$TiS$_2$/p-SiO$_2$/Al (or Ti), similar to Examples 5 and 6, except for a porous silicon dioxide (p-SiO$_2$) active layer (formed by CVD or from a sol-gel of tetraethoxyorthosilicate, TEOS) substituted for a-Si or p-Si.

EXAMPLE 8

Ti/Cu$_{2-x}$S/p-SiO$_2$/Al (or Ti), similar to Example 7, except that Cu$_{2-x}$S (preferably Cu$_{1.8}$S) is substituted for Li$_x$TiS$_2$ as a passive layer. The Cu$_{2-x}$S passive layer may be formed by first depositing (e.g., vapor depositing) an about 100–300 Å thick layer of Cu (150 Å presently preferred) on the surface of the lower electrode (Ti), followed by an about 15 min. treatment of the Cu layer with H$_2$S gas in a chamber at room temperature for reaction to form Cu$_{2-x}$S.

EXAMPLE 9

Ti/Cu$_{2-x}$S/Cu$_2$O/Al (or Ti), similar to Example 8, except that CuO is substituted for p-SiO$_2$ as an active layer. The Cu$_{2-x}$S passive layer is first formed by depositing (e.g., vapor depositing) an about 200–400 Å thick layer of Cu (250 Å presently preferred) on the surface of the lower electrode (Ti), followed by an about 10 min. treatment of the Cu layer with H$_2$S gas in a chamber at room temperature for reaction to form Cu$_{2-x}$S. The Cu$_{2-x}$S layer is then reacted with O$_2$ gas in a chamber for about 10 min. to form a layer of Cu$_2$O over the layer of Cu$_{2-x}$S.

EXAMPLE 10

Ti/Cu$_{2-x}$Se/p-SiO$_2$/Al (or Ti), similar to Example 8, except that Cu$_{2-x}$Se is substituted for Cu$_{2-x}$S as the passive layer by using H$_2$Se gas in place of H$_2$S for reaction with the initially deposited Cu layer.

EXAMPLE 11

Ti/Ag$_2$S/p-SiO$_2$/Al (or Ti), similar to Example 8, except that Ag$_2$S is substituted for Cu$_{2-x}$S as the passive layer. The Ag$_2$S passive layer may be formed by first depositing (e.g., vapor depositing) an about 100–300 Å thick layer of Ag (150 Å presently preferred) on the surface of the lower electrode (Ti), followed by about 15 min. reaction with H$_2$S in a chamber at room temperature to form Ag$_2$S.

EXAMPLE 12

Ti/Cu$_{2-x}$S/BN/Al (or Ti), similar to Example 8, with an about 50–300 Å thick layer of CVD-deposited BN (100 Å presently preferred) substituted for p-SiO$_2$ as the active layer.

EXAMPLE 13

Ti/Cu$_{2-x}$S/C$_3$N/Al (or Ti), similar to Example 8, with an about 50–300 Å thick layer of CVD-deposited, amorphous C$_3$N (100 Å presently preferred) substituted for p-SiO$_2$ as the active layer.

EXAMPLE 14

Ti/Cu$_{2-x}$S/BaTiO$_3$/Al (or Ti), similar to Example 8, with an about 50–300 Å thick layer of CVD-deposited, ferroelectric BaTiO$_3$ (100 Å presently preferred) substituted for p-SiO$_2$ as the active layer.

EXAMPLE 15

Ti/Cu$_{2-x}$S/polyester/Al (or Ti), similar to Example 8, with an about 50–300 Å thick layer of spin-coated polystyrene (100 Å presently preferred) substituted for p-SiO$_2$ as the active layer.

EXAMPLE 16

Ti/CuWO$_3$/p-Si/Al (or Ti), similar to Example 6, except that CuWO$_3$ is substituted for Li$_x$TiS$_2$ as the passive layer. The CuWO$_3$ passive layer may be formed by first depositing (e.g., vapor depositing) an about 100–300 Å thick layer (150 Å presently preferred) of tungsten (W) on the surface of the lower (Ti) electrode, and reacting the W layer with O$_2$ gas in a chamber for about 10 min. to form a layer of WO$_3$. A layer of CuI is then spin-coated onto the layer of WO$_3$ and the combination reacted at about 150° C. to form Cu$_x$WO$_3$.

EXAMPLE 17

Ti/Cu—CuI/p-Si/Al (or Ti), similar to Example 6, except that Cu—CuI is substituted for Li$_x$TiS$_2$ as the passive layer. The Cu—CuI passive layer may be formed by first depositing (e.g., vapor depositing) an about 100–300 Å thick layer (150 Å presently preferred) of copper (Cu) on the surface of the lower (Ti) electrode, followed by spin-coating a layer of CuI on the Cu layer.

EXAMPLE 18

CU/Cu$_{2-x}$S/p-SiO$_2$/Al (or Ti), similar to Example 8, except that the first electrode is made of Cu rather than Ti.

EXAMPLE 19

Ag/Ag$_2$S/p-SiO$_2$/Al (or Ti), similar to Example 11, except that the first electrode is made of Ag rather than Ti.

The above-described illustrative, but non-limitative examples of memory devices or cells fabricated according to the inventive concept and methodology reflect the extreme flexibility and versatility with regard to device structures and materials selection afforded by the present invention. Inasmuch as the read, write, and erase characteristics of the inventive devices are readily amenable to variation by means of appropriate selection of materials and layer thicknesses, the inventive devices are well suited for use in a variety of applications currently employing conventional semiconductor-based memory devices. Moreover, the inventive memory devices are readily fabricated in cost-effective manner utilizing conventional manufacturing technologies.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials, structures, and techniques have not been described in detail in order not to unnecessarily obscure the present invention.

Only the preferred embodiments of the present invention and but a few examples of its versatility are shown and described in the present invention. It is to be understood that the present invention is capable of use in various other embodiments and is susceptible of changes and/or modifications within the scope of the inventive concept as expressed herein.

What is claimed is:

1. A memory storage and retrieval device, comprising:
   (a) an electrically conductive first electrode;
   (b) an electrically conductive second electrode; and
   (c) a layer stack between said first and second electrodes, said layer stack comprising:
   (d) at least one active layer with variable electrical conductivity, said electrical conductivity of said at least one active layer is reversibly upon introduction of charged species thereinto and removed of said charged species therefrom; and
   (e) at least one passive layer comprised of a source material for varying said electrical conductivity of said at least one active layer upon application of an electrical potential difference between said first and second electrically conductive electrodes, said at least one passive layer is comprised of said source material for reversibly donating said charged species to and accepting said charged species from said active layer.

2. The memory storage and retrieval device according to claim 1, wherein:
   said charged species comprise ions or a combination of ions and electrons.

3. The memory storage and retrieval device according to claim 2, wherein:
   said ions are selected from the group consisting of: metal ions, metal-containing ions, non-metal ions, and non-metal-containing ions.

4. The memory storage and retrieval device according to claim 1, wherein:
   said layer stack comprises a pair of active layers in mutual contact.

5. The memory storage and retrieval device according to claim 1, wherein said layer stack further comprises:
   (f) at least one barrier layer comprised of a material which impedes spontaneous movement of said charged species when said electrical potential difference is not applied between said first and said second electrically conductive electrodes.

6. The memory storage and retrieval device according to claim 5, wherein:
   said at least one barrier layer is positioned within said layer stack between said active layer and said passive layer.

7. The memory storage and retrieval device according to claim 5, wherein:
   said layer stack comprises first and second active layers, and said at least one barrier layer is positioned within said layer stack between said first and second active layers.

8. The memory storage and retrieval device according to claim 7, wherein:
   said layer stack comprises first and second passive layers in respective contact with said first and second electrically conductive electrodes.

9. The memory storage and retrieval device according to claim 1, wherein:
   said at least one active layer and said at least one passive layer are each comprised of the same material, whereby said layer stack effectively comprises a single layer.

10. The memory storage and retrieval device according to claim 1, wherein:
    each of said first and second electrically conductive electrodes comprises at least one electrically conductive material selected from the group consisting of metals, metal alloys, metal nitrides, oxides, sulfides, carbon, and polymers.

11. The memory storage and retrieval device according to claim 10, wherein:
    each of said first and second electrically conductive electrodes comprises at least one material selected from the group consisting of aluminum (Al), silver (Ag), copper (Cu), titanium (Ti), tungsten (W), their alloys and nitrides, amorphous carbon, transparent oxides, transparent sulfides, and organic polymers.

12. The memory storage and retrieval device according to claim 11, wherein:
    each of said first and second electrically conductive electrodes is from about 3,000 to about 8,000 Å thick.

13. The memory storage and retrieval device according to claim 12, wherein:
    each of said first and second electrically conductive electrodes is about 5,000 Å thick.

14. The memory storage and retrieval device according to claim 1, wherein:
    said at least one active layer comprises at least one material with a relatively lower intrinsic electrical conductivity when free of said charged species and a relatively higher electrical conductivity when doped with said charged species.

15. The memory storage and retrieval device according to claim 14, wherein:
    said at least one active layer comprises at least one material selected from the group consisting of dielectrics, semiconductors, ferroelectrics, ceramics, organic polymers, molecular crystals, and composites thereof.

16. The memory storage and retrieval device according to claim 15, wherein:
    said at least one active layer comprises at least one material including a plurality of channels or pores extending therethrough for facilitating movement of said charged species therein, selected from the group consisting of Si, amorphous Si, organic polymers, silicon dioxide ($SiO_2$), aluminum oxide ($Al_2O_3$), titanium dioxide ($TiO_2$), boron nitride (BN), carbon tri-nitride (CN$_3$), copper oxide (Cu$_2$O), vanadium oxide (V$_2$O$_3$), ferroelectric materials, materials containing electrolyte clusters, and intercalation compounds selected from Li$_x$VSe$_2$ and Li$_x$HfSe$_2$.

17. The memory storage and retrieval device according to claim 14, wherein:

said at least one active layer is from about 50 to about 1,000 Å thick.

18. The memory storage and retrieval device according to claim 17, wherein:

said at least one active layer is about 100 Å thick.

19. A memory storage and retrieval device, comprising:

(a) an electrically conductive first electrode;

(b) an electrically conductive second electrode; and (c) a layer stack between said first and second electrodes, said layer stack comprising:

(d) at least one active layer with variable electrical conductivity, said electrical conductivity of said at least one active layer is reversibly varied upon introduction of charged species thereinto and removed of said charged species therefrom; and (e) at least one passive layer comprised of a source material for varying said electrical conductivity of said at least one active layer upon application of an electrical potential difference between said first and second electrically conductive electrodes, said at least one passive layer is comprised of said source material for reversibly donating said charged species to and accepting said charged species from said active layer, said source material comprises at least one super-ionic conductor material or intercalation compound.

20. The memory storage and retrieval device according to claim 19, wherein:

said at least one super-ionic conductor material or intercalation compound reversibly donates and accepts charged species.

21. The memory storage and retrieval device according to claim 20, wherein:

said at least one super-ionic conductor material or intercalation compound reversibly donates and accepts charged species in the form of ions or a combination of ions and electrons, said ions selected from the group consisting of silver (Ag), copper (Cu), gold (Au), lithium (Li), sodium (Na), potassium (K), zinc (Zn), magnesium (Mg), other metal or metal-containing ions, hydrogen (H), oxygen (O), fluorine (F), and other halogen-containing ions.

22. The memory storage and retrieval device according to claim 21, wherein:

said at least one super-ionic conductor material or intercalation compound is selected from the group consisting of AgI, AgBr, Ag$_2$S, Ag$_2$Se, Ag$_{2-x}$Te, RbAg$_4$I$_5$, CuI, CuBr, Cu$_{2-x}$S, Cu$_{2-x}$Se, Cu$_{2-x}$Te, Ag$_x$Cu$_{2-x}$S, Cu$_3$HgI$_4$, Cu$_3$HgI$_4$, AuI, Au$_2$S, Au$_2$Se, Au$_2$S$_3$, Na$_x$Cu$_y$Se$_2$, LiNiO$_2$, Li$_x$TiS$_2$, Li$_x$MoSe$_2$, Li$_x$TaS$_2$, Li$_x$VSe$_2$, Li$_x$HfSe$_2$, Li$_x$WO$_3$, Cu$_x$WO$_3$, Na$_x$WO$_3$, Naβ-Al$_2$O$_3$, (AgI)$_x$(Ag$_2$O$_n$B$_2$O$_3$)$_{1-x}$, Ag$_2$CdI$_4$, Cu$_x$Pb$_{1-x}$Br$_{2-x}$, Li$_3$M$_2$(PO$_4$)$_3$—where M=Fe, Sc, or Cr, K$_3$Nb$_3$B$_2$O$_{12}$, K$_{1-x}$Ti$_{1-x}$Nb$_x$OPO$_4$, SrZr$_{1-x}$Yb$_x$O$_3$, Sr$_{1-x/2}$Ti$_{1-x}$, Nb$_x$O$_{3-\delta}$, β-Mg$_3$Bi$_2$, Cs$_5$H$_3$(SO$_4$)$_x$.H$_2$O, M$_3$H(XO$_4$)$_2$—where M=Rb, Cs, or NH$_4$ and X=Se or S, NaZr$_2$(PO$_4$)$_3$, Na$_{4.5}$FeP$_2$O$_8$(OF)$_{1-x}$, ZrO$_{2-x}$, CeO$_{2-x}$, CaF$_2$, and BaF$_2$.

23. The memory storage and retrieval device according to claim 19, wherein:

said at least one passive layer is from about 20 to about 100 Å thick.

24. The memory storage and retrieval device according to claim 23, wherein:

said at least one passive layer is about 50 Å thick.

25. The memory storage and retrieval device according to claim 5, wherein:

said at least one barrier layer comprises at least one material selected from the group consisting of Li$_3$N and LiAlF$_4$.

26. The memory storage and retrieval device according to claim 5, wherein:

said at least one barrier layer is from about 20 to about 300 Å thick.

27. The memory storage and retrieval device according to claim 26, wherein:

said at least one barrier layer is about 50 Å thick.

28. The memory storage and retrieval device according to claim 9, wherein:

said at least one active layer and said at least one passive layer are each comprised of the same intercalation compound.

29. The memory storage and retrieval device according to claim 28, wherein:

said at least one active layer and said at least one passive layer are each comprised of Li$_x$VSe$_2$ or Li$_x$HfSe$_2$.

30. A memory storage and retrieval device, comprising:

(a) an electrically conductive first electrode;

(b) an electrically conductive second electrode; and (c) a layer stack between said first and second electrodes, said layer stack comprising:

(d) at least one active layer with variable electrical conductivity, said electrical conductivity of said at least one active layer is reversibly varied upon introduction of charged species thereinto and removed of said charged species therefrom; and (e) at least one passive layer comprised of at least one super-ionic conductor material or intercalation compound for varying said electrical conductivity of said at least one active layer upon application of an electrical potential difference between said first and second electrically conductive electrodes, said at least one passive layer is comprised of said at least one super-ionic conductor material or intercalation compound for reversibly donating said charged species to and accepting said charged species from said active layer, said at least one passive layer has a thickness from about 20 to about 100 Å.

* * * * *